United States Patent [19]

Köhler et al.

[11] Patent Number: 4,922,004
[45] Date of Patent: May 1, 1990

[54] COPOLYMERIZABLE PHOTOINITIATORS

[75] Inventors: Manfred Köhler, Darmstadt; Jörg Ohngemach, Reinheim; Eike Poetsch, Mühltal, all of Fed. Rep. of Germany

[73] Assignee: Merck Patent Gesellschaft mit bescrankter Haftung, Darmstadt, Fed. Rep. of Germany

[21] Appl. No.: 912,473

[22] Filed: Sep. 29, 1986

[30] Foreign Application Priority Data

Sep. 28, 1985 [DE] Fed. Rep. of Germany ....... 3534645

[51] Int. Cl.$^5$ .................... C07C 67/30; C07C 49/76
[52] U.S. Cl. .................... 560/221; 560/252; 560/254; 568/331
[58] Field of Search ............ 560/221, 252, 254; 568/331

[56] References Cited

FOREIGN PATENT DOCUMENTS 2443414 3/1976 Fed. Rep. of Germany ...... 560/221

*Primary Examiner*—Paul J. Killos
*Attorney, Agent, or Firm*—Millen, White & Zelano

[57] ABSTRACT

The invention relates to copolymerizable photoinitiators of the general formula I

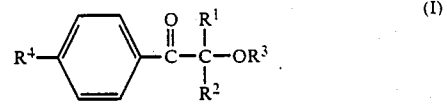

in which
$R^1$ and $R^2$ are each H, $C_1$–$C_6$-alkyl or phenyl,
$R^3$ is H, $C_1$–$C_6$-alkyl, $C_1$–$C_6$-alkyl, $C_1$–$C_6$-alkanoyl or the group Z,
$R^4$ is H, halogen, $C_1$–$C_{12}$-alkyl, $C_1$–$C_{12}$-alkoxy, $C_1$–$C_{12}$-alkylthio
or the group $-X[(CH_2-CH_2-O)_n-Z]_m$ and
X os O, S or N
n is an integer from 0 to 4,
m is the integer 1 for X=O and S or the integer 1 or 2 for X=N,
Z is the group $-CO-CR=CR'R''$
with R, R', R'' each being H or $CH_3$, always at least one of the $R^3$ or $R^4$ groups containing the group Z.

11 Claims, No Drawings

COPOLYMERIZABLE PHOTOINITIATORS

BACKGROUND OF THE INVENTION

The invention relates to copolymerizable photoinitiators useful for the photopolymerization of ethylenically unsaturated compounds and also to systems containing such compounds.

Photochemically induced polymerization reactions have attained great importance in industry, particularly in the rapid hardening of thin films, as, for example, in the hardening of paint or resin coatings on paper, metal and plastics or in the drying of printing inks, since these processes are distinguished from conventional methods for printing and coating articles by raw material and energy savings and reduced environmental pollution. However, the preparation of polymeric materials by polymerizing appropriate unsaturated monomeric starting materials is frequently effected photochemically, for which customary processes such as solution and emulsion polymerizations can be used.

Since with the aforementioned reactions it is generally the case that none of the reactants is capable of absorbing photochemically active radiation to an adequate degree, it is necessary to add so-called photoinitiators which are either capable of absorbing incident high-energy radiation, usually UV light, and of forming active starter radicals which in turn initiate photopolymerization, or are capable of transferring the absorbed energy for free radical formation to one of the polymerizable reactants. The initiators do not normally participate in the actual polymerization reaction.

The initiators used hitherto for photopolymerizing unsaturated compounds have been in the main benzophenone derivatives, benzoin ethers, benzil ketals, dibenzosuberone derivatives, anthraquinones, xanthenones, thioxanthones, α-halogenactophenone derivatives, dialkoxyacetophenones and hydroxyalkyl phenones.

Essential criteria for the selection of such initiators are, e.g., the nature of the reactions to be carried out, the ratio of the absorption spectrum of the initiator to the spectral energy distribution of the available source of irradiation, the activity of the initiator, the solubility of the initiator in the reaction mixture, the dark storage life of the reaction system to which the initiator has been added, and the action on the end products by residues remaining therein of the initiator and/or of the products formed therefrom in the course of the photochemical reaction.

As is known, however, the technical feasibility of many of the substances mentioned is restricted, in some instances severely, by a number of disadvantages. These particularly include insufficient reactivity to initiate the photopolymerization of ethylenically unsaturated compounds. In addition to molecule-specific reactivity, the crucial factor here in many cases is the solubility, or the ideally uniform incorporability of the photoinitiators in the photopolymerizable systems.

However, owing to their favorable properties, the hydroxyalklphenones of German Offenlegungsschrift No. 2,722,264, corresponding to U.S. Pat. Nos. 4,347,111 and 4,477,681, have proved to be particularly advantageous. This specific class of substances is present at the typical application temperature range in the liquid state; this results in an excellent solubility or a homogeneous incorporability in conventional photopolymerizable systems. Furthermore, these photoinitiators are of an above average activity and at the same time the systems to which they are added have a remarkably favorable dark storage life. Nonetheless, hydroxyalkylphenone photoinitiators are still improvable.

Since these compounds, like the other conventional photoinitiators, do not participate in the actual photopolymerization, their excess, unreacted residues and their degradation products formed during the photochemical reaction remain in the finished product. Depending on the precise nature and amount of the product this can lead to more or less pronounced effects on the properties of the product. In the case of photopolymerized paint coatings, the main field of use for photoinitiators, such residues can, for examples, affect the obtainable final hardness of the layer. Also, it is possible for undesirable color changes, for example, yellowing, to occur, frequently only after a prolonged time period. Initiator residues and/or degradation products, owing to their more or less pronounced volatility, can become noticeable through unpleasant odor; their diffusion out of the coating and into surrounding media can create problems, for example where packaging materials with photopolymerized coatings, such as, for example, tins and tubes, are provided for foodstuffs. Particularly in this field of use the question of utility is crucially determined by the possible or known toxicity of the photoinitiators and their degradation products.

The prior art discloses certain photoinitiators which have unsaturated substituents, as well as other classes of substituents. They are predominantly benzoin and benzil derivatives. However, apart from the compound α-allylbenzoin, which in its initiator action approaches the hydroxyalkylphenones, such unsaturated photoinitiators have not become established, since they do not offer any significant advantages with respect to content of unreacted residues and degradation products in the polymer product, and in other aspects are inferior to the hydroxyalkylphenones.

SUMMARY OF THE INVENTION

It is thus an object of the invention to provide photoinitiators which are structured, for example, through copolymerizable ethylenically unsaturated substituents, such that they participate directly in the photopolymerization reaction and their residues or degradation products are substantially in the polymer structure, while also retaining the required properties such as initiator action and compatibility with customary radiation-hardenable systems which are at least equivalent to the best of the known photoinitiators.

Upon further study of the specification and appended claims, further objects and advantages of this invention will become apparent to those skilled in the art.

It has now been found, surprisingly, that these requirements are very well satisfied by, in a composition aspect, the new compounds of the general formula I

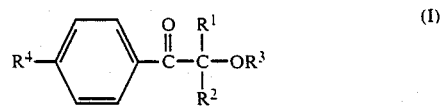

in which
R$^1$ and R$^2$ are each H, C$_1$–C$_6$-alkyl or phenyl,
R$^3$ is H, C$_1$–C$_6$-alkyl, C$_1$–C$_6$-alkanoyl or the group Z,
R$^4$ is H, halogen, C$_1$–C$_{12}$-alkyl, C$_1$–C$_{12}$-alkoxy, C$_1$–C$_{12}$-alkylthio.

or the group —X[(CH$_2$—CH$_2$—O)$_n$—Z]$_m$ and
X is O, S or N
n is an integer from 0 to 4,
m is the integer 1 for X=O and S, or the integer 1 or 2 for X=N,
Z is the group —CO—CR=CR'R"
with R, R', R" each being H or CH$_3$, and always at least one of the R$^3$ or R$^4$ groups containing the group Z.

In a method of use aspect the invention comprises using effective amounts of the compounds of the formula I as copolymerizable photoinitiators for photopolymerizing ethylenically unsaturated compounds, or systems containing such compounds.

In a process aspect, the invention further comprises a process for photopolymerizing ethylenically unsaturated compounds, or a system containing such compounds, in which the mixture to be polymerized has added to it, before the initiation of the photopolymeriztion, at least one compound of the formula I as a copolymerizable photoinitiator.

The invention additionally provides photopolymerizable systems containing at least one ethylenically unsaturated photopolymerizable compound and, where appropriate, further known and customary additives, these systems containing least one compound of the formula I as a copolymerizable photoinitiator.

DETAILED DISCUSSION

The novel compounds of the formula I are structurally derived from hydroxyalkylphenone photoinitiators, but, unlike the latter, contain ethylenically unsaturated groups of the acryloyl type.

In accordance with the earlier recited formula I, at least one of the radicals R$^3$ or R$^4$ always is or contains the group Z having the structure —CO—CR=CR'R", wherein R, R' and R" can each be hydrogen or methyl, and the group Z is preferably acryloyl or methacryloyl.

When in the formula I only the radical R$^3$ is the group Z, the corresponding compounds are esterification products of hydroxylalkylphenones with acrylic acid or acrylic acid derivaties. R$^1$ and R$^2$ can then each be hydrogen, C$_{1-6}$-alkyl or phenyl, and R$^4$ can be hydrogen, halogen, C$_{1-12}$-alkyl, -alkoxy or - alkylthio.

Preferred compounds are those in which R$^1$ and R$^2$ are methyl.

Corresponding photoinitiators include, for example:
phenyl 2-acryloyloxy-2-propyl ketone phenyl 2-methacryloyloxy-2-propyl ketone 4-isopropylphenyl 2-acryloyloxy-2-propyl ketone 4-chlorophenyl 2-acryloyloxy-2-propyl ketone 4-dodecylphenyl 2-acryloyloxy-2-propyl ketone 4-methoxyphenyl 2-acryloyloxy-2-propyl ketone.

When in the formula I the radical R$^4$ contains the group Z, the resulting compounds are hydroxyalkylphenone derivatives which, in the para-position of the phenyl ring, carry unsaturated radicals of the acryloyl type. These radicals can be bonded to the phenyl ring via an oxygen, sulphur or nitrogen atom and/or via one or more oxyethylene bridges. The bonding via an oxyethylene bridge is preferred.

The other substitutents can be freely chosen in accordance with the definitions given. Preferred photoinitiators are those in which R$^1$ and R$^2$ are methyl and R$^3$ is hydrogen.

The corresponding compounds are, for example:
4-acryloyloxyphenyl 2-hydroxy-2-propyl ketone
4-methacryloyloxyphenyl 2-hydroxy-2-propyl ketone
4-(2-acryloyloxyethoxy)-phenyl 2-hydroxy-2-propyl ketone
4-(2-acryloyloxydiethoxy)-phenyl 2-hydroxy-2-propyl ketone
4-(2-acryloyloxyethoxy)-benzoin
4-(2-acryloyloxyethylthio)-phenyl 2-hydroxy-2-propyl ketone
4-N,N'-bis-(2-acryloyloxyethyl)-aminophenyl 2-hydroxy-2-propyl ketone.

However, it is also advantageous when, in the formula I, not only the substituent R$^3$, but also the substituent R$^4$ contains unsaturated radicals of the acryloyl type. The resulting compounds are hydroxyalkylphenone derivatives whose hydroxyl groups are on the one hand esterified with acrylic acid or acrylic acid derivatives, and on the other, in the para-position, carry acryloyl radicals on the phenyl ring via oxygen, sulphur, nitrogen and/or one ore more oxyethylene bridges. Here too, preference is given to those compounds of which the other substituents R$^1$ and R$^2$ are methyl. Corresponding photoinitiators include, for example:
4-acryloyloxyphenyl 2-acryloyloxy-2-propyl ketone
4-methacryloyloxyphenyl 2-meythacryloyloxy-2-propyl ketone
4-(2-acryloyloxyethoxy)-phenyl 2-acryloyloxy-2-propyl ketone
4-(2-acryloyloxydiethoxy)-phenyl 2-acryloyloxy-2-propyl ketone.

Particularly preferred photoinitiators according to the invention are the compounds:
phenyl 2-acryloyloxy-2-propyl ketone
4-acryloyloxyphenyl 2-hydroxy-2-propyl ketone
4-acryloyloxyphenyl 2-acryloyloxy-2-propyl ketone
4-(2-acryloyloxy)-phenyl 2-hydroxy-2-propyl ketone
4-(2-acryloyloxyethoxy)-phenyl 2-acryloyloxy-2-propyl ketone.

The compounds of the general formula I can be prepared by standard processes of organic chemistry known to those in the art. Suitable reaction conditions therein can be taken from the standard works of preparative organic chemistry, for example, HOUBEN-WEYL, Methoden der organischen Chemie [Methods of organic chemistry], Georg-Thieme Verlag, Stuttgart, or ORGANIC SYNTHESIS, J. Wiley, New York, London, Sydney. In general, it is advantageous to prepare the photoinitiators of the invention, or their precursors, by the methods of synthesis which are customary for the known hydroxyalkylphenone photoinitiators. These methods are described in detail in German Offenlegungsschrift No. 2,722,264. Compounds of the formula I in which the radical R$^3$ is the unsaturated group Z can be obtained in a simple manner from commercially available or conventionally prepared hydroxyalkylphenones by esterification; for example, with acryloyl halide and a customary esterification catalyst, preferably a tertiary amine. For instance, the novel initiator phenyl 2-acryloyloxy-2-propyl ketone can be prepared from phenyl 2-hydroxy-2-propyl ketone (phenyl-2-hydroxy-2-methylpropan-1-one; Daracur® 1173, E. Merck) by esterification with acryloyl chloride/triethylamine.

Compounds of the formula I in which R$^4$ contains the unsaturated group Z can be obtained, for example, by subjecting suitable phenyl derivatives which contain Z, or a grouping into which Z is easily introducible, to a Friedel-Crafts acylation with an appropriate carbonyl halide to introduce the photoinitiator active structure or a precursor thereof.

Examples of phenyl derivatives which are suitable for use as starting materials are phenol, 4-thiophenol, 4-aminophenol and monoethoxylated or polyethoxylated phenol such as 2-hydroxyethyl phenyl ether.

For the Friedel-Crafts acylation it is advisable to protect the terminal functional groups by means of suitable, subsequently redetachable protective groups, for example by acylation in the case of the OH group. After introduction of the photoinitiator active structure the terminal OH group can then be esterified in conventional manner, for example with acrylic acid.

Phenyl derivatives which already contain the unsaturated group Z, can also be phenyl acrylate, phenyl methacrylate or terminally acrylated, monoethoxylated or polyethoxylated phenol such as acryloyloxyethyl phenyl ether. With these starting materials, however, there does exist the danger of premature polymerization during the subsequent reactions.

To produce the photoinitiator active structure of the hydroxyalkylphenone type, it is possible to acylate, for example, with isobutyroyl halide or α-chloroisobutyroyl halide and subsequently to introduce the hydroxyl, alkoxy or alkanoyloxy group. For instance, the Friedel-Crafts acylation of acylated 2-hydroxyethyl phenyl ether with isobutyroyl chloride and a subsequent bromination and hydrolysis on the tertiary C atom leads to the compound 4-(2-hydroxyethoxy)phenyl 2-hydroxy-2-propyl ketone. From this compound it is possible to obtain, for example by selective esterification with acryloyl chloride/tertiary amines, the novel initiator 4-(2-acryloyloxyethoxy)-phenyl 2-hydroxy-2-propyl ketone and, by esterification of both OH groups, the novel initiator 4-(2-acryloyloxyethoxy)-phenyl 2-acryloyloxy-2-propyl ketone.

When the bonding of the unsaturated radical $R^4$ to the aromatic is effected via sulphur (X=S), substitution of appropriate 4-halogenoaryl ketones with thiols such as 2-mercaptoethanol under basic conditions is possible. N,N-disubstituted anilines (X=N) can be acylated under Vilsmeier conditions, for example, with N,N-dimethylisobutyramide and phosphorus oxychloride. Esterification of the OH groups with unsaturated acid chlorides gives the corresponding copolymerizable photoinitiators.

The compounds of the general formula I are highly active photoinitiators and can generally be used in photopolymerizable systems, provided the latter contain ethylenically unsaturated, photopolymerizable compounds.

The photoinitiators of the invention, owing to the specific, unsaturated substituent(s) Z, have the property that they, or their degradation products which are formed in the photoinitiator reaction, can function as copolymerizble comonomers in the photopolymerization reaction. This fact, as the experiment reproduced within the framework of the examples below, surprisingly leads to an unexpectedly high degree, e.g., about 90 to 98%, of incorporation of unreacted photoinitiators and of photoinitiator degradation products in the polymer product which is eventually obtained. This is consequently a very effective way of reducing, or entirely eliminating undesirable impurities in the properties of the end product. Prior art photoinitiators, including those with olefinically unsaturated substituents, such as acrylated benzoin and benzil derivatives or α-allylbenzoin, lead to residues remaining in the polymer product in a range of about 20 to 80%. It has further been found that practically no loss of activity occurs on introducing the unsaturated substituents Z in the hydroxyalkylphenone photoinitiator structure The compounds of the general formula I can be used according to the invention as photoinitiators for photopolymerizing ethylenically unsaturated compounds and/or for hardening photopolymerizable systems which contain such compounds, and, in particular, as UV hardeners for printing inks and in the irradiation hardening of aqueous prepolymer dispersions. This use is effected in conventional manner The compounds to be used according to the invention are added to the systems to be polymerized, in general, in amounts of 0.1 to 20% by weight, preferably 0.5 to 12% by weight.

This addition generally takes the form of simple dissolving and stirring, since most of the photoinitators to be used according to the invention are liquid or at least readily soluble in the systems to be polymerized. A system to be polymerized is to be understood as meaning a mixture of monofunctional or polyfunctional ethylenically unsaturated monomers, oligomers, prepolymers, polymers or mixtures of these oligomers, prepolymers and polymers with unsaturated monomers, which is initiable by free radicals and which, if necessary or desired, can contain further additives such as, for example, antioxidants, light stabilizers, dyes, pigments, but also further known photoinitiators and also reaction accelerants Suitable unsaturated compounds are all those C=C double bonds which are activated by, for example, halogen atoms, carbonyl, cyano, carboxyl, ester, amide, ether or aryl groups or by conjugated further double or triple bonds. Examples of such compounds are vinyl chloride, vinylidene chloride, acrylonitrile, methacrylonitrile, acrylamide, methacrylamide, methyl, ethyl, n- or tert.-butyl, cyclohexyl, 2-ethylhexyl, benzyl, phenyloxyethyl, hydroxyethyl, hydroxypropyl, lower alkoxyethyl, tetrahydrofurfuryl acrylate or methacrylate, vinyl acetate, propionate, acrylate, succinate, N-vinylpyrrolidone, N-vinylcarbazol, styrene, divinylbenzene, substituted styrenes, and also mixtures of such unsaturated compounds. Even polyunsaturated compounds such as, for example, ethylene diacrylate, 1,6-hexanediol diacrylate, propoxylated bisphenol A diacrylate and dimethacrylate, trimethylolpropane diacrylate and pentaerythritol triacrylate can be polymerized with the photoinitiators used according to the invention. Additional photopolymerizable compounds are unsaturated oligomers, prepolymers or polymers and their mixtures with unsaturated monomers. These include, for example, unsaturated polyesters, unsaturated acrylic materials, epoxy materials, urethanes, silicones, aminopolyamide resins and, in particular, acrylated resins such as acrylated silicone oil, acrylated polyesters, acrylated urethanes, acrylated polyamides, acrylated soya bean oil, acrylated epoxy resin, acrylated acrylic resin, preferably in mixture with one or more acrylates of a mono-, di- or polyalcohol.

The photopolymerizable compounds or systems can be stabilized by adding known thermal inhibitors and antioxidants, such as, for example, hydroquinone or hydroquinone derivatives, pyrogallol, thiophenols, nitro compounds, β-naphthylamines or β-napthols, in the customary amounts without significantly impairing the initiator action of the photoinitiators according to the invention. The main purpose of such additions is to prevent premature polymerization during the preparation of the systems by mixing of the components.

It is also possible to add small amounts of light stabilizers, such as, for example, benzophenone derivatives, benzotriazole derivatives, tetraalkylpiperidines or phenyl salicylates.

To exclude the inhibiting action of air oxygen, photopolymerizable systems frequently also include paraffin or similar waxy substances. As a consequence of insufficient solubility in the polymer, they appear as a solid, floating phase at the start of the polymerization and form a transparent surface layer which prevents the access of air therein. Air oxygen can also be deactivated, for example by introducing autoxidizable groups, such as, for example, allyl groups, into the system to be hardened.

The photoinitiators according to the invention can also be used in combination with known free radical initiators, such as, for example, peroxides, hydroperoxides, ketone peroxides or percarboxylic acid esters. Furthermore, they can contain pigments or dyes of the type customary, for example, in photochemically hardening printing inks. In this case, the amount of photoinitiator is chosen to be higher, for example 6 to 12% by weight, while 0.1 to 5% by weight is in most cases fully sufficient for colorless photopolymerizable products. Depending on the intended use, it is possible to add fillers, such as talcum, gypsum or silica, fibers, organic additives such as thixotroping agents, flow control agents, binders, lubricants, matting agents, plasticizers, wetting agents, silicones for improving the constitution of the surface, antiflotation agents or minor amounts of solvents.

Examples of known photoinitiators which, where appropriate, are usable together with the initiators according to the invention are benzophenones such as, for example, Michler's ketone [4,4'-bis(dimethylamino)benzophenone], 4,4'-bis(diethylamino)benzophenone, p-dimethylaminobenzophenone, p-chlorobenzophenone, benzophenone; anthraquinones such as, for example, anthraquinone, 2-chloroanthraquinone, 2-alkylanthraquinones; xanthones, such as, for example, 2-halogenoxanthones or 2-alkylxanthones; thioxanthones such as 2-chlorothioxanthones, 2-alkylthioxanthones; acridanones such as, for example, 2-alkylacridanones or N-substituted acridanones; benzoins such as, for example, p-dimethylaminobenzoin and alkyl ethers of benzoin; benzil ketals, α-halogenoketones, dialkoxyacetophenones, α-hydroxyalkylphenones and α-aminoalkylphenones as described, for example in German Offenlegungsschrift No. 2,722,264 and European Offenlegungsschrift No. 3,002, and also for example fluorenones, dibenzosuberones, phenanthrenquinones, benzoic acid esters such as, for example, hydroxypropyl benzoate and benzoyl benzoate acrylate.

Mixtures with known initiators contain the copolymerizable photoinitiators utilized according to the teachings of the invention in ammounts of at least 10% by weight, preferably of 50 to 95% by weight, relative to the total amount of initiator mixture used.

It is advantageous to use in the photopolymerizable systems, in addition to the copolymerizable photoinitiators according to the invention, suitable reaction accelerants.

Examples of reaction accelerants which can be added are organic amines, phosphines, alcohols and/or thiols, all of which have at least one CH group which is in the α-position relative to the hetero atom. Suitable are, for example, primary, secondary and tertiary aliphatic, aromatic, araliphatic or heterocyclic amines as described, for example, in U.S. Pat. No. 3,759,807. Examples of such amines are butylamine, dibutylamine, tributylamine, cyclohexylamine, benzyldimethylamine, dicyclohexylamine, triethanolamine, N-methyldiethanolamine, phenyldiethanolamine, piperidine, piperazine, morpholine, pyridine, quinoline, ethyl p-dimethylamino-benzoate, butyl p-dimethylamino-benzoate, 4,4'-bis(dimethylamino)benzophenone (Michler's ketone) or 4,4'-bis(diethylamino)benzophenone. Particularly preferred are tertiary amines such as, for example, trimethylamine, triisopropylamine, tributytlamine, octyldimethylamine, dodecyldimethylamine, triethanolamine, N-methyldiethanolamine, N-butyldiethanolamine, tris(hydroxypropyl)amine, alkyl dimethylaminobenzoates. Other suitable reaction accelerants are, for example, trialkylphosphines, secondary alcohols and thiols. The addition of such reaction accelerants can vary within their customary amounts.

Photopolymerizable systems which also contain a tertiary organic amine as a reaction accelerant are a particularly preferred form of the present invention.

The expression "photopolymerization of ethylenically unsaturated compounds" is to be understood in the broadest sense. It includes, for example, the further polymerizing or the crosslinking of polymeric materials, for example of prepolymers, the homopolymerization, copolymerization and terpolymerization of simple monomers, and also combinations of the types of the reactions mentioned.

By exposing the photopolymerizable systems containing the copolymerizable photoinitiators according to the invention to the action of high-energy radiation, preferably UV light, the photopolymerization can be initiated. The photopolymerization is effected in accordance with methods known per se, namely by irradiating with light or UV radiation of the wavelength range of 250–500 nm, preferably of 300–400 nm. The sources of radiation used can be sunlight or artificial radiators. Advantageous are, for example, mercury vapor high-pressure, medium-pressure or low-pressure lamps and also xenon and tungsten lamps.

The photopolymerization using the photoinitiators according to the invention can be carried out not only batchwise but also continuously. The precise irradiation time depends on the way the photopolymerization is carried out, on the nature and concentration of the polymerizable materials used, on the nature and amount of the photoinitiators used and on the intensity of the light source and, as, for example, in the radiation hardening of coatings, can be within the range from a few seconds to minutes, but in the case of large batches, as for example in mass polymerization, can also be of the order of hours.

The compounds of the formula I are preferably used as photoinitiators in the UV hardening of thin films such as, for example, surface coatings on all customary materials and supports. These can be, e.g., paper, wood, textile base materials, plastic and metal. An important field of use is also the drying and/or hardening of printing inks and screen printing materials, of which the latter are preferably used in the surface coating and design of, for example, tins, tubes and metallic closure caps. Owing to either the very substantial or complete absence of free initiator residues after photopolymerization from the systems containing copolymerization photoinitiators according to the invention, these systems are particularly suitable for use in fields of application where any diffusion of such residues into media surrounding corresponding end products is to be ruled out, for example when packaging materials with photopolymerized coatings come into contact with foodstuffs.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are by weight, unless otherwise indicated.

EXAMPLE 1

Phenyl 2-acryloyloxy-2-propyl ketone

To 5.0 g (0.03 mol) of commercially available phenyl 2-hydroxy-2.propyl ketone in 40 ml of dioxane are added under inert gas protection 5.4 g (0.06 mol) of acryloyl chloride and then, dropwise with stirring, a mixture of 6.1 g (0.06 mol) of triethylamine and 5 ml of dioxane. This is followed by refluxing for one hour and, after cooling down, discharge of the reaction mixture into 300 ml of ice-water. Extraction with ethyl acetate, removal of the solvent and recrystallization from methyl t-butyl ether gave 3.2 g of the photoinitiator with a melting point of 89° C.

Prepared analogously: phenyl 2-methacryloyloxy-2-propyl ketone.

EXAMPLE 2

4-(2-Acryloyloxyethoxy)-phenyl 2-hydroxy-2-propyl ketone (a) To 880 g (6.6 mol) of anhydrous aluminium chloride in 480 ml of dichloromethane are added dropwise with stirring at $-5°$ to 0° C. 336 g (3.2 mol) of isobutyrol chloride in the course of 40 minutes. At the same temperature 540 g (3.0 mol) of 2-phenoxyethyl acetate are then added dropwise in the course of 2 hours. The dropwise addition is followed by stirring at the stated temperature for a further 2 hours and subsequent discharge of the reaction mixture into a mixture of 1.8 l of concentrated hydrochloric acid and 5 kg of ice. The organic phase is separated off, and the aqueous layer is extracted with dichloromethane. The combined organic phases are washed with water, dried and concentrated, and the residue is distilled in vacuo. This gives 740 g of 4-(2-acetoxyethoxy)-phenyl 2-propyl ketone having a boiling point of 145°–152° C./0.3–0.5 torr.

(b) 250 g (1.0 mol) of 4-(2-acetoxyethyloxy)-phenyl 2propyl ketone are dissolved in 200 ml of glacial acetic acid, and 192 g (1.2 mol) of bromine are added at 25° C. with stirring in the course of 2 hours. This is followed by about 10 hours of stirring and subsequent discharge in 3 l of glacial acetic acid. The product is extracted with ethyl acetate. The combined extracts are dried, and concentrating gives 365 g of a viscous oil. This oil is dissolved in 1 l of ethanol, and 380 g of 32% strength sodium hydroxide solution are then added at 25° C. with stirring in the course of 20 minutes. This is followed by 10 minutes of stirring and the subsequent removal of ethanol. The oily residue is discharged into 3 l of ice-water, and this mixture is extracted repeatedly with a total of 1.5 l of ethyl acetate. Drying, filtering and concentrating of the solution gives 250 g of isolated oily crude product. Recrystallization from acetone/petroleum ether and/or chromatographic purification gives 145 g of 4-(2-hydroxyethoxy)-phenyl 2-hydroxy-2-propyl ketone in the form of a colourless solid substance having a melting point of 88°–90° C.

(c) 27.0 g (0.12 mol) of 4-(2-hydroxyethoxy)-phenyl 2-hydroxy-2-propyl ketone are dissolved in 240 ml of dioxane. 12.0 g (0.132 mol) of acryloyl chloride in 20 ml of dioxane are then added dropwise at room temperature with stirring, followed by 16.8 g (0.132 mol) of quinoline in 20 ml of dioxane. This is followed by stirring at 50° C. for 1 h, cooling down and discharge onto 1 l of ice-water. The mixture is extracted 3 times with 250 ml of ethyl acetate each time. Drying and concentrating of the organic phase gives 20.8 g of the photoinitiator in the form of a viscous oil.

$^1$H-NMR (CDCl$_3$): δ 1.6 (s, 6 H, 2 CH$_3$), 4.3 (m, 2 H, CH$_2$), 4.6 (m, 2 H CH$_2$), 5.3 (s, 1H, OH), 5.9–6.5 (m, 3 olefinic H), 7.0 (m, 2 aromatic H), 8.1 (m, 2 aromatic H) ppm.

IR: ν 1710 (CO): 3500 (OH) cm$^{-1}$.

Prepared analogously:

4-(2-Methacryloyloxyethoxy)-phenyl 2-hydroxy-2-propylketone $^1$H-NMR (CDCl$_3$): δ 1,6 (s, 6 H, 2 CH$_3$); 2,0 (s, 3 H, CH$_3$); 4,3 (t, 2 H, CH$_2$); 4,5 (t, 2 H, CH$_2$), 5,6 (s, 1 olef. H); 6,2 (s, 1 olef. H); 7,0 (d, 2 arom.H); 8,1 (d, 2 arom. H) ppm.

4-(2-Acrlyoyloxyethythio)-phenyl 2-hydroxy-2-propylketone $^1$H-NMR ((CDCl$_3$): δ 1,6 (s, 6 H, 2 CH$_3$); 3,3 (t, 2 H, CH$_2$); 4,4 (t, 2 H CH$_2$); 5,8 bis 6,4 (m, 3 olef. H): 7,4 (d, 2 arom. H); 8,0 (d, 2 arom. H) ppm.

EXAMPLE 3

4-(2-Acryloyloxyethoxy)-phenyl 2-acryloyloxy-2-propyl ketone 27.0 g (0.12 mol) of the 4-(2-hydroxyethoxy)-phenyl 2-hydroxy-2-propyl ketone obtained in Example 2a are esterified with 24.0 g (0.264 mol) of acryloyl chloride and 26.4 g (0.264 mol) of triethylamine. Corresponding working up gives 22.8 g of the photoinitiator with a melting point of 71° C.

EXAMPLE 4

4-Acryloxyphenyl 2-hydroxy-2-propyl ketone

To a solution of 2.2 g (0.012 mol) of 4-hydroxyphenyl 2-hydroxy-2-propyl ketone in 20 ml of anhydrous tetrahydrofuran are added at room temperature with stirring and a little at a time 0.4 g (0.013 mol) of sodium hydride (80% strength in paraffin oil). 15 min later, 1.2 g (0.013 mol) of acryloyl chloride in 5 ml of anhydrous tetrahydrofuran are added dropwise in 10 min, which is followed by stirring for a further 1 hour. Working up (see Example 2 c) gives 2.5 g of a viscous, colourless oil.

$^1$H-NMR (CDCl$_3$): δ 1.5 (S, 6 H, 2 CH$_3$), 6.0 to 6.6 (m, 3 olefinic H), 7.1 (m, 2 aromatic H), 8.0 (m, 2 aromatic H) ppm.

Prepared analogously: 4-methacryloyloxyphenyl 2-hydroxy-2-propyl ketone.

$^1$H-NMR (CDCl$_3$): δ 1,6 (s 6 H 2 CH$_3$); 2,1 (s 3 H, CH$_3$); 5,8 (s, 1 olef. H); 7,3 (d, 2 arom. H); 8,1 (d, 2 arom.H) ppm.

EXAMPLE 5

4-acryloyloxyphenyl 2-acryloyloxy-2-propyl ketone 2.2 g (0.012 mol) of 4-hydroxyphenyl 2-hydroxy-2-propyl ketone, 2.4 g (0.027 mol) of acryloyl chloride and 2.7 g (0.027 mol) of triethylamine are reacted in 30 ml of dioxane, and worked up, as in Example 3. This gives 3.6 g of a white, crystalline product having a melting point of 90°–93° C. (recrystallized from cyclohexane).

Prepared analogously: 4-methacryloyloxyphenyl-2-methacryloyloxy-2-propyl ketone.

$^1$H-NMR (CDCl$_3$): 1,8 (s, 6 H, 2 CH$_3$); 5,8 bis 6,7 (m, 6 olef. H); 7,2 (d, 2 arom. H): 8,1 (d, 2 arom. H) ppm.

Examples 6–9 below describe the use of the copolymerizable photoinitiators according to the invention in radiation-hardenable binder systems.

EXAMPLE 6

A UV-hardenable binder system which consists of 75 parts by weight of an oligomeric epoxy acrylate (Laromer ® LR 8555 from BASF) and 25 parts by weight of hexanediol diacrylate has added to it 5 parts by weight of phenyl 2-acryloyloxy-2-propyl ketone (initiator according to Example 1).

The ready-to-use formulation is applied to degreased glass plates (10×10 cm) with spiral wires in a thickness of 50 pm. The coatings are then hardened in an irradiator ("Mini-Cure" from Primarc Ltd.) underneath a mercury medium-pressure lamp (lamp power 80 watt/cm) at a belt speed of 10 m/min. The exposure gap is about 10 cm.

The fully hardened coatings obtained are completely odourfree and exhibit no yellowing.

An analogous method is used to obtain similar results with the initiators of Example 2–5.

EXAMPLE 7

A UV-hardenable binder system consisting of 60 parts by weight of an acrylated polyurethane prepolymer (Prepolymer VPS 1748, from Degüssa AG), 40 parts by weight of hexanediol diacrylate, 15 parts by weight of pentaerythritol triacrylate and 5 parts by weight of 4-(2-acryloyloxyethoxy)-phenyl 2-hydroxy-2-propyl ketone (initiator according to Example 2) is processed into 50 μm thick coatings and hardened at a belt speed of 30 m/min, analogously to Example 6. The fully hardened coatings obtained are completely odourfree and colourless.

The corresponding use of the initiators according to Example 1 and 3–5 gives similar results.

EXAMPLE 8

63.5 parts of an epoxy acrylate resin (Laromer ® 8555 from BASF, Ludwigshafen) are ground up on a three-roll mill together with 36.5 parts of butanediol diacrylate and 20 parts of Heliogen Blue. 5 parts of 4-(2-acryloyloxyethoxy)-phenyl 2-hydroxy-2-propyl ketone (initiator according to Example 2) are stirred into the suspension within 10 minutes. The printing ink thus obtained is printed onto glazed paper in a 1 μm film thickness and is hardened with a radiation output of 160 W/cm at a belt speed of 50 m/min. The odourfree printed sheets obtained are immediately stackable. According to the colour difference measurement, the blue print shows no shift in colour due to yellowing.

The method of Example 8 is also suitable for using the photoinitiator mentioned in Example 1 and 3–5 as UV hardeners for printing inks.

EXAMPLE 9

63.5 parts by weight of a urethane acrylate resin (Uvimer ® 530 from Bayer, Leverkusen) are porcelain ball milled together with 36.5 parts of butanediol diacrylate and 100 parts of titanium dioxide (anatase). 5 parts by weight of 4-acryloyloxyphenyl 2-hydroxy-2-propyl ketone (initiator according to Example 4) and 3 parts by weight of N-methyldiethanolamine are then stirred in. The paint applied to glass plates in a film thickness of 10 μm can be hardened at a belt speed of 50 m/min and with a radiation output of 160 W/cm to give an odourless, yellowing-free film.

The method of Example 9 is also suitable for incorporating the compounds mentioned in Examples 1 to 3 and 5 as photoinitiators in a pigmented lacquer.

The test reproduced in Example 10 below shows the advantages of the copolymerizable photoinitiators according to the invention over known photoinitiators with respect to residual content of initiator in the photopolymerized layer under optimal conditions for the final hardness of the layer.

EXAMPLE 10

Test

A UV-hardenable binder system was prepared to consist of
- 75% by weight of a prepolymer based on an acrylated epoxy resin (Laromer ® EA 81, BASF AG),
- 25% by weight of hexanediol diacrylate.

To identical portions of this binder system were added in each case 5% by weight of the following photoinitiators:
- No. 1 4-(2-acryloyloxyethoxy)-phenyl 2-hydroxy-2-propyl ketone (initiator according to the invention and Example 2)
- No. 2 Phenyl 2-hydroxy-2-propyl ketone (Darocur ®1173, E. Merck; for comparison)
- No. 3 α-allylbenzoin (for comparison)
- No. 4 α-allylbenzoin allyl ether (for comparison).

Samples of the homogeneous, ready-to-use UV coatings were applied in a known manner with a spiral wire to glass plates (10×10) in a film thickness of 50 pm. In preliminary tests the optimal hardening conditions for these surface coatings were initially determined. To this end, the coated plates were passed in a UV laboratory dryer (Beltrolux, from Beltron) on a variable speed conveyor belt (2.5 to 40 m/min) at a distance of about 1 cm and past underneath 2 mercury medium pressure lamps each of 50 watt radiation output/cm. On the day after the UV hardening the layer hardness obtained in each case was determined by determining the König pendulum hardness (DIN 53157).

The hardness determination in accordance with this standard is based on the fact that the damping of the swing of a pendulum which rests on the layer increases with the softness of the layer. The pendulum hardness is deemed to be measured by the time span in seconds in which the deflection of the swinging pendulum decreases from 6° to 3° relative to the vertical. The longer the damping time, the harder the layer.

The coatings produced with the present UV-hardenable binder systems were found to have, as obtainable final hardness, a pendulum hardness of 210 seconds, which was obtainable in the case of initiators No. 1 (initiator according to the invention) and No. 2 at a maximum belt speed of 10 m/min (corresponds to a minimum exposure time of 6 s/m) and in the case of initiators No. 3 and No. 4 at 5 m/min (12 s/m).

To determine the proportions of unreacted initiator still present in these coatings after the UV hardening, these layers were detached from the base materials and comminuted, and samples thereof were weighed out accurately into extraction vessels and were each treated for 2 hours in an ultrasonic bath with identical amounts of acetonitrile as extractant. The solutions obtained were then analysed by means of high pressure liquid chromatography for their initiator content.

Table 1 below shows, for the coatings obtained with the respective photoinitiators (pendulum hardness 210 s) the respectively extractable amount of initiator (amount of initiator used in the unhardened binder system=100%).

TABLE 1

| Initiator No. | UV hardening belt speed | Extractable amount of initiator |
|---|---|---|
| 1 | 10 m/min | 6.5% |
| 2 | 10 m/min | 66% |
| 3 | 5 m/min | 40% |
| 4 | 5 m/min | 26% |

Result

It is found that, in the case of UV hardening under optimal conditions, the amounts of initiator extractable out of the coatings obtained with the known initiators (Nos. 2, 3 and 4) are higher by a factor of 4 to 10 than in the case of hardening with the copolymerizable initiator according to the invention (No. 1.).

From this it is possible to infer that the initiator according to the invention is virtually completely incorporated in the polymer material by copolymerization, which is evidently not the case with the known initiators, including in particular the unsaturated allylbenzoin derivatives.

It is also found that the initiator according to the invention is comparable in its activity with the known hydroxyalkylphenone initiator.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A compound of the general formula

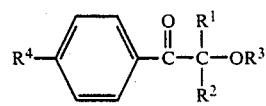

(I)

in which
$R^1$ and $R^2$ are each $C_1$–$C_6$-alkyl,
$R^3$ is H, $C_1$–$C_6$-alkyl, $C_1$–$C_6$-alkanoyl or the group Z,
$R^4$ is H, halogen, $C_1$–$C_{12}$-alkyl, $C_1$–$C_{12}$-alkoxy, $C_1$–$C_{12}$-alkylthio,
or the group $-X[(CH_2-CH_2-O)_n-Z]_m$ and
X is O, S or N
n is an integer from 0 to 4,
m is the integer 1 for X=O and S or the integer 1 or 2 for X=N,
Z is the group $-CO-CR=CR'R''$
with R, R', and R'' each being H or $CH_3$, with the proviso that at least one of the $R^3$ and $R^4$ groups contains the group Z.

2. A compound of claim 1 wherein $R^1$ and $R^2$ are methyl.

3. 4-acryloyloxyphenyl 2-hydroxy-2-propyl ketone, 4-acryloyloxyphenyl 2-acryloyloxy-2-propyl ketone, 4-(2-acryloyloxy)-phenyl 2-hydroxy-2-propyl ketone, or 4-(2-acryloyloxyethoxy)-phenyl 2-acryloyloxy-2-propyl ketone, each a compound of claim 1.

4. Phenyl 2-acryloyloxy-2-propyl ketone, phenyl 2-methacryloyloxy-2-propyl ketone, 4-isopropylphenyl 2-acryloyloxy-2-propyl ketone, 4-chlorophenyl 2-acryloyloxy-2-propyl ketone, 4-dodecylphenyl 2-acryloyloxy-2-propyl ketone or 4-methoxyphenyl 2-acryloyloxy-2-propyl ketone, each a compound of claim 1.

5. 4-acryloyloxyphenyl 2-hydroxy-2-propyl ketone, 4-methacryloyloxyphenyl 2-hydroxy-2-propyl ketone, 4-(2-acryloyloxyethoxy)-phenyl 2-hydroxy-2-propyl ketone, 4-(2-acryloyloxydiethoxy)-phenyl 2-hydroxy-2-propyl ketone, 4-(2-acryloyloxyethylthio)-phenyl 2-hydroxy-2-propyl ketone or 4-N,N'bis-(2-acryloyloxyethyl)-aminophenyl 2-hydroxy-2-propyl ketone, each a compound of claim 1.

6. 4-acryloyloxyphenyl 2-acryloyloxy-2-propyl ketone, 4-methacryloyloxyphenyl 2-methacryloyloxy-2-propyl ketone 4-(2-acryloyloxyethoxy)-phenyl 2-acryloyloxy-2-propyl ketone or 4-(2-acryloyloxydiethoxy)-phenyl 2-acryloyloxy-2-propyl ketone, each a compound of claim 1.

7. A compound of claim 1 wherein Z is acryloyl or methacryloyl.

8. A compound of claim 1 wherein $R^3$ is H.

9. A photopolymerizable composition comprising a photopolymerizable ethylenically unsaturated compound and an amount of a compound of claim 1 effective as a photoinitiator.

10. A composition of claim 9 wherein the amount of said photoinitiator is 0.1 to 20% of weight.

11. A composition of claim 9 further comprising another photoinitiator lacking group Z, a sensitizer or a combination thereof.

* * * * *